(12) United States Patent
Nishio et al.

(10) Patent No.: US 11,934,226 B2
(45) Date of Patent: *Mar. 19, 2024

(54) FOLDABLE DISPLAY AND PORTABLE TERMINAL DEVICE

(71) Applicant: TOYOBO CO., LTD., Osaka (JP)

(72) Inventors: Shotaro Nishio, Tsuruga (JP); Kiwamu Kawai, Tsuruga (JP); Akira Shimizu, Tsuruga (JP); Katsuya Ito, Osaka (JP)

(73) Assignee: TOYOBO CO., LTD., Osaka (JP)

(*) Notice: Subject to any disclaimer, the term of this patent is extended or adjusted under 35 U.S.C. 154(b) by 355 days.

This patent is subject to a terminal disclaimer.

(21) Appl. No.: 17/429,147

(22) PCT Filed: Jan. 15, 2020

(86) PCT No.: PCT/JP2020/001044
§ 371 (c)(1),
(2) Date: Aug. 6, 2021

(87) PCT Pub. No.: WO2020/162120
PCT Pub. Date: Aug. 13, 2020

(65) Prior Publication Data
US 2022/0164003 A1    May 26, 2022

(30) Foreign Application Priority Data

Feb. 8, 2019 (JP) .................................. 2019-021187
Apr. 25, 2019 (JP) .................................. 2019-083808
Jul. 12, 2019 (JP) .................................. 2019-130039

(51) Int. Cl.
*G06F 1/16* (2006.01)
*G02B 1/04* (2006.01)
(Continued)

(52) U.S. Cl.
CPC ............. *G06F 1/1652* (2013.01); *G02B 1/04* (2013.01); *G02B 1/14* (2015.01); *G02B 5/3033* (2013.01)

(58) Field of Classification Search
CPC .................. G02B 1/00–1/18; G02B 5/00–5/32
See application file for complete search history.

(56) References Cited

U.S. PATENT DOCUMENTS 4,561,724 A   12/1985  Otaki et al.
5,429,855 A    7/1995  Kotani et al.
(Continued)

FOREIGN PATENT DOCUMENTS

CN   1760703 A   4/2006
CN   1967294 A   5/2007
(Continued)

OTHER PUBLICATIONS

European Patent Office, Extended European Search Report in European Patent Application No. 20753154.2 (dated Oct. 10, 2022).
(Continued)

*Primary Examiner* — Prashant J Khatri
(74) *Attorney, Agent, or Firm* — Leydig, Voit & Mayer, Ltd.

(57) ABSTRACT

Provided is a foldable display that is excellent in mass production applicability and unlikely to have image distortion at the folding portion of the display after repeated folding, as well as a mobile device equipped therewith. The foldable display contains a surface protection film and a polarizer. The surface protection film is composed of a polyester film, and the angle made by the slow axis of the polyester film with the absorption axis of the polarizer is 10 to 80°. The polyester film has a refractive index in the bending direction of 1.590 to 1.620, a refractive index in the direction of a folding portion of 1.670 to 1.700, a refractive
(Continued)

index in the thickness direction of 1.520 or less, and a density of 1.380 g/cm³ or more, wherein the bending direction refers to a direction orthogonal to the folding portion of the polyester film to be folded.

8 Claims, 1 Drawing Sheet

(51) Int. Cl.
*G02B 1/14* (2015.01)
*G02B 5/30* (2006.01)

(56) References Cited

U.S. PATENT DOCUMENTS

| | | |
|---|---|---|
| 5,833,880 A | 11/1998 | Siemensmeyer et al. |
| 2002/0034709 A1 | 3/2002 | Fukuda et al. |
| 2002/0036285 A1 | 3/2002 | Prechtl et al. |
| 2003/0072893 A1 | 4/2003 | Nakano et al. |
| 2004/0028925 A1 | 2/2004 | Kusume et al. |
| 2004/0075080 A1 | 4/2004 | Prechtl et al. |
| 2004/0212767 A1 | 10/2004 | Sasaki et al. |
| 2005/0099562 A1 | 5/2005 | Nishikouji et al. |
| 2006/0077320 A1 | 4/2006 | Hata et al. |
| 2006/0210709 A1 | 9/2006 | Shutou |
| 2008/0193747 A1 | 8/2008 | MacDonald et al. |
| 2008/0233312 A1* | 9/2008 | Nakamura ............... G02B 1/14 428/1.31 |
| 2009/0068472 A1 | 3/2009 | Umemoto et al. |
| 2009/0137761 A1 | 5/2009 | Irisawa et al. |
| 2009/0247782 A1 | 10/2009 | Irisawa et al. |
| 2009/0269513 A1 | 10/2009 | Nishiyama et al. |
| 2009/0275742 A1 | 11/2009 | Sano et al. |
| 2011/0315306 A1 | 12/2011 | Goto et al. |
| 2012/0052197 A1 | 3/2012 | Sawada et al. |
| 2012/0055607 A1 | 3/2012 | Kitagawa et al. |
| 2012/0055608 A1 | 3/2012 | Kitagawa et al. |
| 2012/0055621 A1 | 3/2012 | Goto et al. |
| 2012/0055622 A1 | 3/2012 | Kitagawa et al. |
| 2012/0055623 A1 | 3/2012 | Kitagawa et al. |
| 2012/0056211 A1 | 3/2012 | Kitagawa et al. |
| 2012/0056340 A1 | 3/2012 | Kitagawa et al. |
| 2012/0057104 A1 | 3/2012 | Kitagawa et al. |
| 2012/0057107 A1 | 3/2012 | Kitagawa et al. |
| 2012/0057231 A1 | 3/2012 | Goto et al. |
| 2012/0057232 A1 | 3/2012 | Goto et al. |
| 2012/0058291 A1 | 3/2012 | Kitagawa et al. |
| 2012/0058321 A1 | 3/2012 | Goto et al. |
| 2012/0107605 A1 | 5/2012 | Ozawa et al. |
| 2012/0229732 A1 | 9/2012 | Koike et al. |
| 2012/0327512 A1 | 12/2012 | Goto et al. |
| 2013/0100529 A1 | 4/2013 | Kitagawa et al. |
| 2013/0114139 A1 | 5/2013 | Kitagawa et al. |
| 2014/0016198 A1 | 1/2014 | Sawada et al. |
| 2014/0044947 A1 | 2/2014 | Sawada et al. |
| 2014/0104519 A1* | 4/2014 | Murata ............... G02B 5/3033 359/489.07 |
| 2014/0186568 A1 | 7/2014 | Kitagawa et al. |
| 2015/0183199 A1 | 7/2015 | Kitagawa et al. |
| 2015/0369981 A1* | 12/2015 | Takeda ............... G02B 5/3025 359/488.01 |
| 2016/0025910 A1 | 1/2016 | Sawada et al. |
| 2016/0035801 A1 | 2/2016 | Kim |
| 2016/0054494 A1 | 2/2016 | Kitagawa et al. |
| 2016/0062012 A1 | 3/2016 | Shin et al. |
| 2016/0103258 A1 | 4/2016 | Kitagawa et al. |
| 2016/0318845 A1 | 11/2016 | Katoh et al. |
| 2017/0276840 A1 | 9/2017 | Horio et al. |
| 2018/0088392 A1 | 3/2018 | Park et al. |
| 2018/0217639 A1 | 8/2018 | Jones et al. |
| 2018/0356564 A1 | 12/2018 | Jeong et al. |
| 2019/0004367 A1 | 1/2019 | Koike et al. |
| 2019/0177577 A1 | 6/2019 | Yamasaki et al. |
| 2019/0219740 A1 | 7/2019 | Horio et al. |
| 2019/0255807 A1 | 8/2019 | Isojima et al. |
| 2020/0269559 A1 | 8/2020 | Inagaki et al. |
| 2021/0179901 A1 | 6/2021 | Fujita et al. |
| 2022/0085307 A1 | 3/2022 | Nishio et al. |
| 2022/0213350 A1 | 7/2022 | Nishio et al. |
| 2022/0227950 A1 | 7/2022 | Nishio et al. |
| 2022/0236467 A1 | 7/2022 | Nishio et al. |
| 2022/0236468 A1 | 7/2022 | Nishio et al. |
| 2022/0246069 A1 | 8/2022 | Nishio et al. |
| 2022/0252763 A1 | 8/2022 | Nishio et al. |

FOREIGN PATENT DOCUMENTS

| | | |
|---|---|---|
| CN | 101160674 A | 4/2008 |
| CN | 101923245 A | 12/2010 |
| CN | 104067352 A | 9/2014 |
| CN | 104159735 A | 11/2014 |
| CN | 105321978 A | 2/2016 |
| CN | 106488839 A | 3/2017 |
| CN | 107867030 A | 4/2018 |
| CN | 109789691 A | 5/2019 |
| EP | 3922668 A1 | 12/2021 |
| JP | S60-097323 A | 5/1985 |
| JP | S60-203422 A | 10/1985 |
| JP | S61-009619 A | 1/1986 |
| JP | S63-001357 B2 | 1/1988 |
| JP | S63-301850 A | 12/1988 |
| JP | H05-049710 B2 | 7/1993 |
| JP | H10-316783 A | 12/1998 |
| JP | H11-513360 A | 11/1999 |
| JP | 2001-324603 A | 11/2001 |
| JP | 2001-350021 A | 12/2001 |
| JP | 2002-030042 A | 1/2002 |
| JP | 2002-178400 A | 6/2002 |
| JP | 2002-229039 A | 8/2002 |
| JP | 2002-265541 A | 9/2002 |
| JP | 2002-303722 A | 10/2002 |
| JP | 2002-308832 A | 10/2002 |
| JP | 2002-317013 A | 10/2002 |
| JP | 2003-089151 A | 3/2003 |
| JP | 2003-520878 A | 7/2003 |
| JP | 2004-204190 A | 7/2004 |
| JP | 2004-529220 A | 9/2004 |
| JP | 2004-299101 A | 10/2004 |
| JP | 2005-154566 A | 6/2005 |
| JP | 2005-263789 A | 9/2005 |
| JP | 2005-331909 A | 12/2005 |
| JP | 2006-285197 A | 10/2006 |
| JP | 2007-016207 A | 1/2007 |
| JP | 2007-076839 A | 3/2007 |
| JP | 2007-094071 A | 4/2007 |
| JP | 2007-510946 A | 4/2007 |
| JP | 2007-119415 A | 5/2007 |
| JP | 2007-121721 A | 5/2007 |
| JP | 2007-126628 A | 5/2007 |
| JP | 2007-133184 A | 5/2007 |
| JP | 2007-138138 A | 6/2007 |
| JP | 2007-140465 A | 6/2007 |
| JP | 2007-156439 A | 6/2007 |
| JP | 2007-186430 A | 7/2007 |
| JP | 2008-149577 A | 7/2008 |
| JP | 2009-093074 A | 4/2009 |
| JP | 2009-109831 A | 5/2009 |
| JP | 2009-149066 A | 7/2009 |
| JP | 2009-199087 A | 9/2009 |
| JP | 2010-168570 A | 8/2010 |
| JP | 2010-228391 A | 10/2010 |
| JP | 2011-002816 A | 1/2011 |
| JP | 2011-154134 A | 8/2011 |
| JP | 2012-073563 A | 4/2012 |
| JP | 2012-107080 A | 6/2012 |
| JP | 2012-214726 A | 11/2012 |
| JP | 2013-033248 A | 2/2013 |
| JP | 2013-101328 A | 5/2013 |
| JP | 2013-114131 A | 6/2013 |
| JP | 2013-184431 A | 9/2013 |
| JP | 2013-210624 A | 10/2013 |
| JP | 2014-065887 A | 4/2014 |
| JP | 2014-186210 A | 10/2014 |

(56) References Cited

FOREIGN PATENT DOCUMENTS

| | | |
|---|---|---|
| JP | 2014-206682 A | 10/2014 |
| JP | 2014-221560 A | 11/2014 |
| JP | 2015-007702 A | 1/2015 |
| JP | 2015-030157 A | 2/2015 |
| JP | 2015-064418 A | 4/2015 |
| JP | 2015-129210 A | 7/2015 |
| JP | 2015-163596 A | 9/2015 |
| JP | 2015-174357 A | 10/2015 |
| JP | 2015-184664 A | 10/2015 |
| JP | 2015-232120 A | 12/2015 |
| JP | 2016-004055 A | 1/2016 |
| JP | 2016-090925 A | 5/2016 |
| JP | 2016-155124 A | 9/2016 |
| JP | 2017-033033 A | 2/2017 |
| JP | 2017-033034 A | 2/2017 |
| JP | 2017-067819 A | 4/2017 |
| JP | 2017-134416 A | 8/2017 |
| JP | 2018-010086 A | 1/2018 |
| JP | 2018-022060 A | 2/2018 |
| JP | 2018-027995 A | 2/2018 |
| JP | 2018-059070 A | 4/2018 |
| JP | 2018-072663 A | 5/2018 |
| JP | 2018-124367 A | 8/2018 |
| JP | 2018-538572 A | 12/2018 |
| JP | 2019-008026 A | 1/2019 |
| TW | 201733807 A | 10/2017 |
| TW | 201839476 A | 11/2018 |
| WO | WO 2001/053384 A1 | 7/2001 |
| WO | WO 2002/062873 A1 | 8/2002 |
| WO | WO 2005/045485 A1 | 5/2005 |
| WO | WO 2006/100830 A1 | 9/2006 |
| WO | WO 2010/100917 A1 | 9/2010 |
| WO | WO 2011/058774 A1 | 5/2011 |
| WO | WO 2013/100042 A1 | 7/2013 |
| WO | WO 2016/010134 A1 | 1/2016 |
| WO | WO 2017/115736 A1 | 7/2017 |
| WO | WO 2018/003963 A1 | 1/2018 |
| WO | WO 2018/150940 A1 | 8/2018 |
| WO | WO 2018/159285 A1 | 9/2018 |
| WO | WO 2019/026753 A1 | 2/2019 |
| WO | WO 2020/162119 A1 | 8/2020 |
| WO | WO 2020/241278 A1 | 12/2020 |
| WO | WO 2020/241279 A1 | 12/2020 |
| WO | WO 2020/241280 A1 | 12/2020 |
| WO | WO 2020/241281 A1 | 12/2020 |
| WO | WO 2020/241312 A1 | 12/2020 |
| WO | WO 2020/241313 A1 | 12/2020 |

OTHER PUBLICATIONS

Yang, "Review of Operating Principle and Performance of Polarizer-Free Reflective Liquid-Crystal Displays," *Journal of the Society for Information Display*, 16(1): 117-124 (2012).
Wikipedia, "Cyclic Olefin Copolymer" (2023) [accessed at https://en.wikipedia.org/wiki/Cyclic_olefin_copolymer].
European Patent Office, Extended European Search Report in European Patent Application No. 20814476.6 (dated Jun. 12, 2023).
European Patent Office, Extended European Search Report in European Patent Application No. 20815401.3 (dated Jun. 12, 2023).
U.S. Appl. No. 17/429,119, filed Aug. 6, 2021.
U.S. Appl. No. 17/614,154, filed Nov. 24, 2021.
U.S. Appl. No. 17/614,201, filed Nov. 24, 2021.
U.S. Appl. No. 17/614,228, filed Nov. 24, 2021.
U.S. Appl. No. 17/614,260, filed Nov. 24, 2021.
U.S. Appl. No. 17/615,426, filed Nov. 30, 2021.
U.S. Appl. No. 17/615,433, filed Nov. 30, 2021.
Japanese Patent Office, International Search Report in International Patent Application No. PCT/JP2020/001044 (dated Mar. 17, 2020).
Lub et al., "The synthesis of liquid-crystalline diacrylates derived from cyclohexane units," *Recl. Trav. Chim. Pays-Bas*, 115(6): 321-328 (1996).
European Patent Office, Extended European Search Report in European Application No. 20815504.4 (dated May 15, 2023).
European Patent Office, Extended European Search Report in European Application No. 20815576.2 (dated May 9, 2023).
European Patent Office, Extended European Search Report in European Patent Application No. 20752680.7 (dated Oct. 26, 2022).
Japanese Patent Office, International Search Report in International Patent Application No. PCT/JP2020/001043 (dated Mar. 24, 2020).
Japanese Patent Office, International Search Report in International Patent Application No. PCT/JP2020/019264 (dated Jul. 21, 2020).
Japanese Patent Office, International Search Report in International Patent Application No. PCT/JP2020/019265 (dated Jul. 21, 2020).
Japanese Patent Office, International Search Report in International Patent Application No. PCT/JP2020/019266 (dated Jul. 28, 2020).
Japanese Patent Office, International Search Report in International Patent Application No. PCT/JP2020/019267 (dated Jul. 21, 2020).
Japanese Patent Office, International Search Report in International Patent Application No. PCT/JP2020/019484 (dated Jul. 28, 2020).
Japanese Patent Office, International Search Report in International Patent Application No. PCT/JP2020/019485 (dated Jul. 14, 2020).
Japan Patent Office, Office Action in Japanese Patent Application No. 2020-086715 (dated Oct. 17, 2023).

\* cited by examiner

FOLDABLE DISPLAY AND PORTABLE TERMINAL DEVICE

CROSS-REFERENCE TO RELATED APPLICATIONS

This patent application is the U.S. national phase of International Patent Application No. PCT/JP2020/001044, filed Jan. 15, 2020, which claims the benefit of Japanese Patent Application No. 2019-021187, filed Feb. 8, 2019, Japanese Patent Application No. 2019-083808, filed Apr. 25, 2019, and Japanese Patent Application No. 2019-130039, filed Jul. 12, 2019, which are incorporated by reference in their entireties herein.

TECHNICAL FIELD

The present invention relates to foldable displays and mobile devices. The present invention further relates to foldable displays and mobile devices that are unlikely to have image distortion caused by deformation of the film even when they are repeatedly folded.

BACKGROUND ART

Becoming thinner and lighter, mobile devices such as smart phones have become widely prevalent. While being required to have a variety of functions, mobile devices are also required to be convenient to use. It is taken for granted that prevailing mobile devices can be operated with one hand for simple tasks, and can be put into a clothes pocket. Thus, such mobile devices must have a small screen size, such as about 6 inches.

Tablet devices with a screen size of 7 to 10 inches are intended for use not only for video content and music, but also for business purposes, drawing, and reading, and thus have a high level of functionality. However, these devices cannot be operated with one hand and are not particularly portable, leaving some issues in regards to convenience.

In order to meet the above requirements, PTL 1 suggests a technique of making compact devices by connecting multiple displays. However, due to the remaining bezel portion, the image is split, and visibility decreases. Thus, this technique is not commonly used.

More recently, mobile devices equipped with a flexible or foldable display have been proposed. This technique enables conveniently carrying a mobile device equipped with a large screen display without problems of image splitting.

Conventional displays and mobile devices that have no folding structure can be protected by a non-flexible material, such as glass, that is applied to the surface of the display. However, a foldable display that uses a single screen spanning over a folding portion must be protected by, for example, a flexible and surface-protecting hard coating film. However, a foldable display is repeatedly folded at the point where a portion folds, and the film at that point deforms over time, causing image distortion on the display. In addition to the surface protection film, films are further used in various parts of a foldable display, such as a polarizing plate, a retardation film, a touchscreen substrate, a substrate of display cells such as organic EL, and protective materials on the back. These films are also required to be durable against repeated folding.

PTL 2 suggests a technique of partially altering the film thickness. However, this method is not suitable for mass production.

A technique to adjust the refractive index of a polyester film in the bending direction is also suggested (see PTL 3). However, the pencil hardness during the application of hard coating decreases with a decrease in the refractive index in the bending direction, thus lowering the surface protection functionality of the display. Additionally, while decreasing the refractive index in one direction reduces deformation that occurs when the display is folded, it makes the folding direction more uniaxially oriented, forming cracks or breaking the display at the folding portion.

CITATION LIST

Patent Literature

PTL 1: JP2010-228391A
PTL 2: JP2016-155124A
PTL 3: WO2018/150940A

SUMMARY OF INVENTION

Technical Problem

The present invention is intended to solve the problems that arise in the parts of conventional displays as described above. The invention is intended to provide a foldable display that is suitable for mass production and that is unlikely to have distortion of images on the folding portion after the display is repeatedly folded, and to provide a mobile device equipped with such a foldable display.

Specifically, the present invention includes the following subject matter.
Item 1. A foldable display comprising a surface protection film and a polarizer,
wherein
 the surface protection film comprises a polyester film,
 the angle made by the slow axis of the polyester film with the absorption axis of the polarizer is 10 to 80°, and
 the polyester film satisfies the following conditions:
 (1) the polyester film has a refractive index in the bending direction of 1.590 to 1.620,
 (2) the polyester film has a refractive index in the direction of a folding portion of 1.670 to 1.700,
 (3) the polyester film has a refractive index in the thickness direction of 1.520 or less, and
 (4) the polyester film has a density of 1.380 g/cm$^3$ or more, wherein the bending direction refers to a direction orthogonal to the folding portion of the polyester film to be folded.
Item 2. The foldable display according to Item 1, wherein the polyester film has an in-plane retardation (Re) of 3000 to 30000 nm.
Item 3. The foldable display according to Item 1 or 2, wherein the polyester film has a total light transmittance of 85% or more, a haze of 3% or less, and a maximum heat shrinkage of 6% or less.
Item 4. The foldable display according to any one of Items 1 to 3, comprising an easy-to-adhere layer on at least one surface of the polyester film.
Item 5. The foldable display according to any one of Items 1 to 4, comprising a hard coating layer having a thickness of 1 to 50 μm on at least one surface of the polyester film.
Item 6. A mobile device comprising the foldable display of any one of Items 1 to 5.

Advantageous Effects of Invention

While the foldable display using a polyester film or a hard coating film for foldable displays according to the present invention maintains its suitability in mass production, the polyester film is unlikely to have cracks at the folding portion, deform after being repeatedly folded, and have image distortion at the folding portion of the display. A mobile device equipped with the above foldable display using a polyester film or hard coating film provides beautiful images and has a variety of functions, while being highly convenient such as in portability.

DESCRIPTION OF EMBODIMENTS

Display

Figure 1:
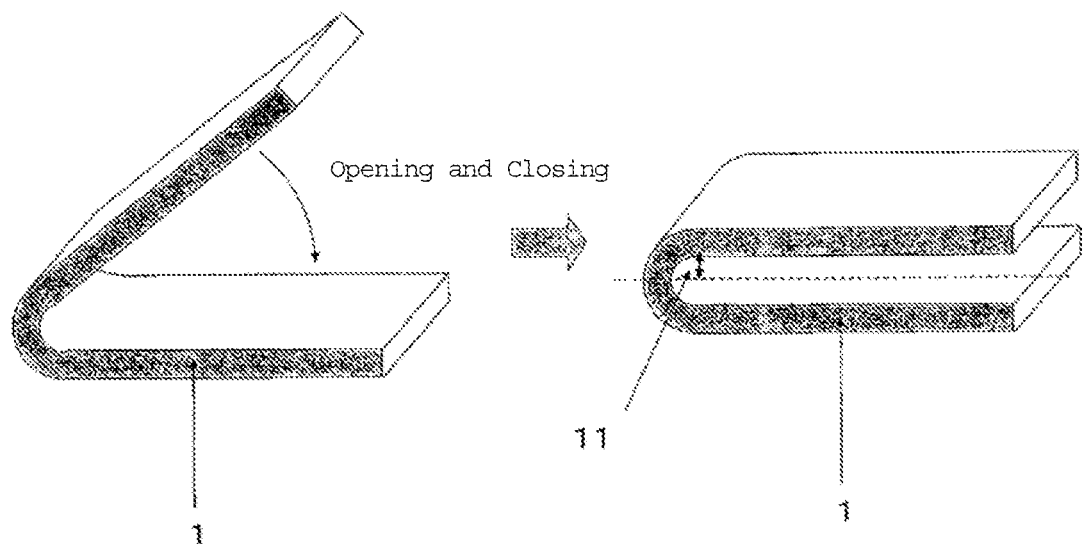
FIG. 1 is a schematic diagram showing the bend radius of the foldable display according to the present invention being folded.

The term "display" as used in the present invention refers to display devices in general. There are several types of displays such as LCDs, organic EL displays, inorganic EL displays, LEDs, and FEDs; however, LCDs, organic ELs, and inorganic ELs, which have a foldable structure, are preferable. In particular, organic EL displays and inorganic EL displays, which can reduce the layer structure, are preferable; and organic EL displays, which have a wide color gamut, are even more preferable.

Foldable Display

A foldable display is a single continuous display that can be folded in half or other ways when carried. The size of the fordable display can be reduced by half or even more by folding it, and thus the portability is improved. The foldable display preferably has a bend radius of 5 mm or less, and more preferably 3 mm or less. A bend radius of 5 mm or less enables the foldable display to be thin when folded. A smaller bend radius is better; however, the smaller the bend radius, the more easily creases form. The bend radius is preferably 0.1 mm or more, or can be even 0.5 mm or more or 1 mm or more. Even a bend radius of 1 mm or more can achieve a reduction in thickness sufficient for practical use in carrying the display. The bend radius of a folded display refers to a value measured at the point indicated by numerical reference 11 in the schematic diagram of FIG. 1, and is the inner radius of the folding portion of the display being folded. The surface protection film, described later, may be positioned on the outer side or inner side of the foldable display.

The foldable display may be a three-fold or four-fold display, or a rollable display, which is a retractable display. All of these displays fall within the scope of the foldable display according to the present invention.

Foldable Organic EL Display

The essential component of a foldable organic EL display is an organic EL module. A foldable organic EL display may further optionally include, for example, a circularly polarizing plate, a touchscreen module, a surface protection film, and a back protection film.

Organic EL Module

A typical structure of an organic EL module includes an electrode, an electron transport layer, a light-emitting layer, a hole transport layer, and a transparent electrode. The polyester film according to the present invention can be used as a substrate on which an electrode is provided, and further an electron transport layer, a light-emitting layer, and a hole transport layer are provided. In particular, the polyester film according to the present invention can be preferably used as a substrate for a transparent electrode. In this case, because the substrate film is required to have a high level of barrier properties against water vapor or oxygen, the polyester film according to the present invention is preferably provided with a barrier layer such as a metal oxide layer. To enhance the barrier properties, multiple barrier layers may be provided, or multiple polyester films provided with a barrier layer may be used.

Touch Panel Module

The mobile device preferably includes a touchscreen. An organic EL display for use preferably includes a touchscreen module on the organic EL display or between the organic EL module and the circularly polarizing plate. The touchscreen module includes a transparent substrate such as a film and a transparent electrode provided on the transparent substrate. The film for use as a transparent substrate for touchscreens is preferably provided with a hard coating layer or a refractive index adjustment layer. The transparent substrate usable in touchscreens includes polyester films, polyimide films, polyamide films, polyamide-imide films, polycarbonate films, acrylic films, triacetyl cellulose films, cyclo-olefin polymer films, polyphenylene sulfide films, and polymethylpentene films.

Circularly Polarizing Plate

The circularly polarizing plate suppresses the deterioration of image quality due to the reflection of external light by the components inside the display. A circularly polarizing plate includes a linear polarizer and a retardation film. The linear polarizer preferably includes a protection film at least on the visible side of the polarizer. Instead of the protection film, a protective coating layer may be provided. A protection film or a protective coating layer may be provided on the side opposite the visible side of the polarizer, and a retardation film may be directly stacked on the polarizer. The retardation film for use is a resin film with a phase difference such as triacetyl cellulose, polycarbonate, or cyclic-olefin, or such a resin film with or without a phase difference provided with a retardation layer composed of a liquid crystal compound. The protection film for polarizers includes those listed above as transparent substrate films for touchscreens.

Surface Protection Film

Because a shock applied to a display from above may break the circuitry of an organic EL module or a touchscreen module, a surface protection film is provided in most cases. In the present invention, a polyester film with specific properties is preferably used as the surface protection film. The surface protection film includes a "cover window," which is incorporated into the top surface of the display, and an "after film," which can be attached, peeled off, and replaced with another by the user. The polyester film with specific properties is usable in both cases, or in either case. If the polyester film with specific properties is used in either case, the other surface protection film for use includes those listed above as transparent substrate films for touchscreens. The polyester film preferably has a hard coating layer stacked at least on the front surface of the polyester film. The polyester film is provided on the front surface of a foldable display with the hard coating layer on the viewing side. The hard coating layer may be provided on both surfaces of the polyester film.

Back Protection Film

A protection film is also preferably provided on the back of the display. The polyester film with specific properties used in the present invention can be used as the protection film for the back. The protection film for the back may be those listed as the transparent substrate film for touchscreens.

The polyester film may be a monolayered film composed of one or more types of polyester resins. If two or more types of polyester are used, the polyester film may be a multilayered film or ultra-multilayered lamination film with a repeating structure.

Examples of polyester resins for use in the polyester film include polyethylene terephthalate, polybutylene terephthalate, polyethylene-2,6-naphthalate, and polyester films composed of copolymers that contain the component of these resins as the main component. In particular, from the standpoint of mechanical properties, heat resistance, transparency, and price, drawn polyethylene terephthalate films are particularly preferable.

When a polyester copolymer is used in a polyester film, the dicarboxylic acid component of the polyester can be, for example, aliphatic dicarboxylic acids, such as adipic acid and sebacic acid; aromatic dicarboxylic acids, such as terephthalic acid, isophthalic acid, phthalic acid, and 2,6-naphthalene dicarboxylic acid; or multifunctional carboxylic acids, such as trimellitic acid and pyromellitic acid. The glycol component can be, for example, fatty acid glycols, such as ethylene glycol, diethylene glycol, 1,4-butanediol, propylene glycol, and neopentyl glycol; aromatic glycols, such as p-xylene glycol; alicyclic glycols, such as 1,4-cyclohexanedimethanol; or polyethylene glycols with an average molecular weight of 150 to 20,000. The mass ratio of the copolymer component of the copolymer is preferably less than 20 mass %. A mass ratio of less than 20 mass % is preferable because film strength, transparency, and heat resistance are retained.

In the production of a polyester film, at least one type of resin pellet preferably has an intrinsic viscosity of 0.50 to 1.0 dl/g. An intrinsic viscosity of 0.50 dl/g or more is preferable because such an intrinsic viscosity increases the shock resistance of the obtained film, and thus makes it unlikely for the internal circuit of the display to be broken by an external shock. An intrinsic viscosity of 1.00 dl/g or less is preferable because it prevents filtration pressure of the molten fluid from becoming too high, thus making it easier to stably perform film production.

The polyester film preferably has a thickness of 10 to 80 μm, and more preferably 25 to 75 μm. A thickness of 10 μm or more provides a pencil hardness improvement effect and an impact resistance improvement effect. A thickness of 80 μm or less is advantageous in weight reduction and provides excellent flexibility, processability, and handleability.

The surface of the polyester film in the present invention may be smooth or uneven. However, a decreased level of optical properties due to unevenness is not preferable, because the film is used for covering the surface of a display. The haze is preferably 3% or less, more preferably 2% or less, and most preferably 1% or less. A haze of 3% or less can improve the visibility of images. Although a lower haze is better, the lower limit of haze may be preferably 0.1% or more, or 0.3% or more, from the standpoint of stable production.

Given the purposes of reducing haze as described above, the film surface should not be too uneven. However, to provide the film with moderate slipperiness for handleability, unevenness may be formed on the film surface by adding particles to the polyester resin layer of the surface layer, or by applying a particle-containing coating layer to the polyester resin layer during the film-forming process.

The method for adding particles to a polyester resin layer can be a known method. For example, particles can be added at any stage of polyester production and can be preferably added in the form of slurry prepared by dispersing the particles in, for example, ethylene glycol, in the esterification stage, after the completion of transesterification, or before the start of polycondensation to facilitate polycondensation. Alternatively, particles can be added by a method of blending slurry prepared by dispersing particles in ethylene glycol or water with a polyester material by using a kneading extruder equipped with a vent, or a method of blending dry particles with a polyester material by using a kneading extruder.

In particular, preferable is a method of homogeneously dispersing the aggregates of inorganic particles in a monomer solution, which is part of a polyester material, then filtering the dispersion, and adding the filtrate to the remainder of the polyester material before, during, or after esterification. Due to the low viscosity of the monomer solution, this method enables homogeneous dispersion of particles and high-precision filtration of the slurry in a simple manner, while ensuring excellent particle dispersibility and low likelihood of the occurrence of new aggregates when particles are added to the remainder of the polyester material. From this viewpoint, it is particularly preferable to add particles to the remainder of the polyester material at a low temperature before esterification.

Additionally, the number of protrusions on the surface of the film can be further reduced by a method of preparing a particle-containing polyester beforehand, and kneading the particle-containing polyester pellets with particle-free pellets to extrude pellets (master batch method).

The polyester film may contain various additives within the range in which the desired total light transmission is maintained. Examples of additives include an antistatic agent, a UV absorber, and a stabilizer.

The polyester film has a total light transmittance of preferably 85% or more, and more preferably 87% or more. A transmittance of 85% or more sufficiently ensures visibility. Although a higher total light transmittance of the polyester film is better, the total light transmittance is preferably 99% or less, or may be 97% or less, from the standpoint of stable production.

The polyester film after heat treatment at 150° C. for 30 minutes has a maximum heat shrinkage of preferably 6% or less, and more preferably 5% or less. A heat shrinkage of 6% or less can reduce flatness errors, such as curling or undulation, during HC processing. Although a lower heat shrinkage is better, the heat shrinkage is preferably −1% or more, and more preferably 0% or more. A negative value means that the polyester film expanded after heating. A value below −1% may also lead to flatness errors.

The polyester film for a foldable display according to the present invention can impart sufficient pencil hardness to a hard coating film formed by laminating a hard coating layer on the polyester film. In the case of conventional polyester films, a hard coating film formed by laminating a hard coating layer on such a conventional polyester film shows a decrease in pencil hardness seemingly due to deformation of the film in the thickness direction in pencil hardness evaluation of the hard coating film. The present invention can achieve a high level of hardness in pencil hardness evaluation of hard coating films by setting the indentation depth of the film in the thickness direction so as to fall within a specific range after unloading a test force with a dynamic ultra-micro hardness tester, described later. The indentation depth of the film in the thickness direction after unloading a test force is preferably 1.5 µm or less, more preferably 1.4 µm or less, and still more preferably 1.3 µm or less. When the indentation depth is 1.5 µm or less after unloading a test force (the final amount of deformation under load), the hard coating film formed by laminating a hard coating layer becomes resistant to deformation in the thickness direction and shows a high level of pencil hardness in pencil hardness evaluation. A hard coating film with a high level of pencil hardness makes it unlikely for the display surface to have scratches and dents, increasing the display visibility. A lower indentation depth is better after unloading a test force; however, from the standpoint of stable production and saturation of the effects, the indentation depth is preferably 0.3 µm or more, and more preferably 0.5 µm or more.

In order to decrease the indentation depth after unloading a test force, it is effective to adjust the refractive index in the thickness direction to 1.52 or less. The means to adjust the refractive index to 1.52 or less includes, for example, the following condition settings within the range in which other physical properties and the refractive index in the bending direction and in the folding direction can be regulated so as to fall within preferable ranges: adjusting the draw ratio in the bending direction or in the folding direction to a high value, setting a low draw temperature in the bending direction or in the folding direction, and setting a high heat fixation temperature. These are described later.

The surface of the polyester film in the present invention can be subjected to treatment for improving adhesion with a resin for forming, for example, a hard coating layer.

Examples of surface treatment methods include unevenness-forming treatment by sandblasting, solvent treatment, etc.; and oxidation treatment such as corona discharge, electron beam irradiation, plasma treatment, ozone-UV irradiation, flame treatment, chromic-acid treatment, and hot-air treatment. These methods can be used without any restriction.

Adhesion can also be improved by an adhesion-improving layer, such as an easy-to-adhere layer. For the easy-to-adhere layer, resins such as acrylic resins, polyester resins, polyurethane resins, and polyether resins can be used without any restriction. The easy-to-adhere layer can be formed by a typical coating technique, preferably "an in-line coating technique."

The polyester film described above can be produced, for example, by performing a polymerization step of homogenously dispersing inorganic particles in a monomer solution, which is part of a polyester material, filtering the dispersion, and adding the filtrate to the remainder of the polyester material to polymerize a polyester; and a film-forming step of melting and extruding the polyester into a sheet form through a filter, and cooling and drawing the sheet to form a substrate film.

Below, the method for producing a biaxially oriented polyester film is described with an example in which pellets of polyethylene terephthalate ("PET" below) are used as a material of a substrate film. However, the method is not limited to this example. Additionally, the example is not intended to limit the number of layers such as a monolayer or a multilayer.

After a predetermined proportion of PET pellets is mixed and dried, the mixture is fed into a known extruder for melting and laminating, and then extruded from the slit die into a sheet form, followed by cooling and solidifying the sheet on a casting roll to form an unstretched film. A monolayer can be produced with a single extruder. A multilayered film (i.e., including two or more layers) can be produced by laminating multiple film layers that each constitute an outermost layer using two or more extruders, a multilayered manifold, or a confluence block (e.g., confluence blocks with a square joint), extruding a sheet of two or more layers from the outlet, and cooling the sheet on a casting roll to prepare an unstretched film.

In this case, it is preferable to perform high-precision filtration to remove foreign matter that may be present in the resin at any portion of the extruder at which the molten resin is maintained at about 280° C. during melt-extrusion. The filter material for use in high-precision filtration of a molten resin can be any material; however, a filter material made of sintered stainless steel is preferable because it is excellent in removing aggregates composed mainly of Si, Ti, Sb, Ge, or Cu and organic matter with a high melting point.

Additionally, the filter material has a filtered particle size (initial filtration efficiency: 95%) of preferably 20 µm or less, particularly preferably 15 µm or less. A filtered particle size (initial filtration efficiency: 95%) exceeding 20 µm may lead to insufficient removal of foreign matter with a size of 20 µm or more. Although high-precision filtration of molten resin using a filter material with a filtered particle size of 20 µm or less (initial filtration efficiency: 95%) may reduce productivity, such a filter material is preferable from the standpoint of obtaining a film that has fewer protrusions caused by coarse particles.

Refractive Index in Bending Direction

Figure 2:
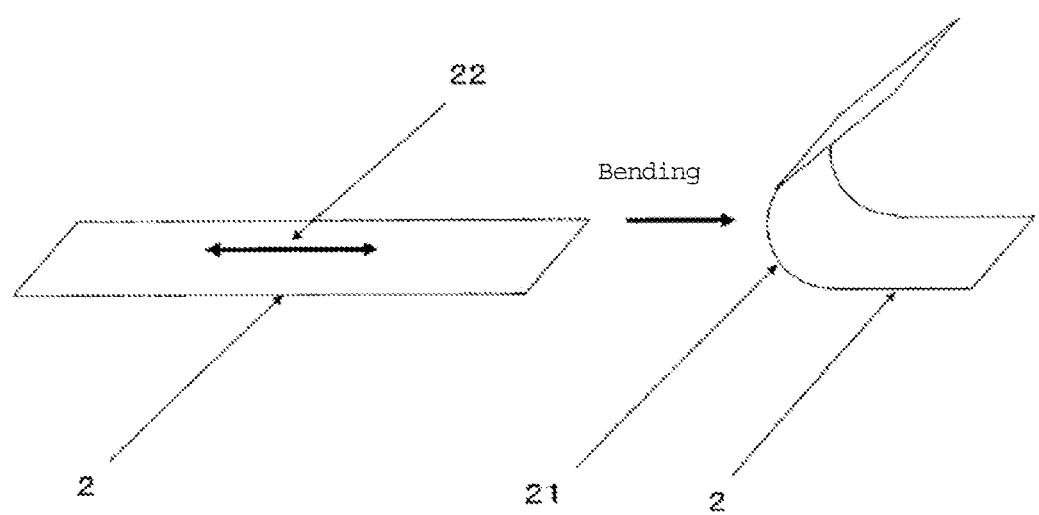
FIG. 2 is a schematic diagram showing the bending direction of the polyester film for a foldable display according to the present invention.

In the present invention, the refractive index of the polyester film at least either in the longitudinal direction (machine direction) or in the width direction is preferably 1.590 to 1.620, and more preferably 1.591 to 1.600. The refractive index of the polyester film in the bending direction is preferably 1.590 to 1.620, and more preferably 1.591 to 1.600. The term "bending direction" as used here refers to a direction that is orthogonal to the folding portion (reference numeral 21) assumed in the use of a foldable display, as indicated by reference numeral 22 on a polyester film (reference numeral 2) shown in FIG. 2. A refractive index of 1.590 to 1.620 at least either in the longitudinal direction or in the width direction is preferable because such a refractive index minimizes the deformation caused by repeatedly folding the foldable display, and eliminates the risk of degrading image quality of the foldable display. The refractive index is more preferably 1.591 to 1.600. Of course, the direction of the refractive index is preferably the bending direction. A refractive index of 1.590 or more enables the display to maintain excellent visibility because it does not cause cracks in the direction of the folding portion after a bending test, described later, and of course, does not cause fracture. The refractive index of a polyester film can be effectively adjusted by adjusting the draw ratio and the draw temperature. Additionally, in order to adjust the refractive index, relaxing in the drawing direction or multi-stage drawing can be performed. In performing multi-stage drawing, it is preferable to set the draw ratio in the second and subsequent stages to a higher ratio than the draw ratio in the first stage.

Fatigue due to compressive stress applied to the inside of the display when the display is folded can be reduced by controlling the refractive index of the polyester film at least either in the longitudinal direction (machine direction) or in the width direction, more preferably the refractive index of the polyester film in the bending direction, so as to fall within the ranges above. Fatigue due to compressive stress is thought to occur mainly in the crystalline portions; fewer crystals in the bending direction causes less fatigue. Thus, lowering the refractive index is thought to reduce the amount of crystals oriented in the bending direction and reduce compressive fatigue.

Additionally, the creep phenomenon caused by tensile stress applied to the outer side of the folded display can be reduced by decreasing the refractive index. Fatigue due to tensile stress is thought to occur mainly in the amorphous portions; repeatedly applied stress causes the molecular chains to align, thus deforming the film. It is inferred that having fewer molecular chains aligned in the bending direction leads to less deformation caused by such an alignment of molecular chains. Because fatigue due to tension can be reduced by decreasing amorphous portions, higher crystallinity (i.e., density) is preferable.

In the present invention, the draw ratio of an unstretched polyester sheet either in the longitudinal direction (machine direction) or in the width direction is preferably 1.2-fold to 2.0-fold, and more preferably 1.7-fold to 2.0-fold. The draw direction is preferably the bending direction. A draw ratio of 1.2-fold or more is preferable due to there being no deformation during post-processing such as hard-coating application, while a draw ratio of 2.0-fold or less is preferable because the film thickness does not become uneven. The draw temperature is preferably 75 to 120° C., and more preferably 75 to 105° C. The heating method for use during drawing can be a known technique, such as a hot-air heating method, a roll heating method, or an infrared heating method. A draw temperature of 75 to 120° C. can prevent the film from having great unevenness in the thickness caused by drawing at a draw ratio within the range described above. Additionally, the refractive index in the thickness direction can be reduced by drawing the film at temperatures as low as possible within the above range in which the film does not have great unevenness in the thickness.

Refractive Index in the Direction of the Folding Portion

The refractive index of the polyester film in the direction orthogonal to the direction in which the refractive index is 1.590 to 1.620 is preferably 1.670 to 1.700. Specifically, the refractive index in the direction orthogonal to the bending direction (the direction of the folding portion) is preferably 1.670 to 1.700. A refractive index of 1.670 to 1.700 can reduce deformation that occurs when the film is folded in the bending direction. A refractive index of 1.700 or less can suppress the formation of cracks or fracture in the direction of the folding portion. A refractive index of 1.670 or more can increase flexibility in the bending direction and increase the surface hardness. A refractive index of 1.680 to 1.695 is more preferable. The refractive index in the direction orthogonal to the bending direction can be adjusted by, for example, the draw ratio, drawing preheating temperature, draw temperature, multi-stage drawing, and film relaxation. The draw ratio is preferably 4.0 to 6.0-fold, more preferably, 4.4 to 6.0-fold. The drawing preheating temperature in the direction orthogonal to the bending direction is preferably 70 to 110° C. In performing multi-stage drawing in the direction orthogonal to the bending direction, it is preferable to set the draw ratio in the second and subsequent states higher than the draw ratio in the first stage. Film relaxation may be performed by 1 to 10% either in the machine direction (longitudinal direction) or in the vertical direction (width direction), or both.

Refractive Index in the Thickness Direction

The refractive index in the thickness direction is preferably 1.520 or less. This is because a refractive index in the thickness direction of 1.520 or less can suppress the reduction in hardness of the film surface even when the refractive index in the bending direction is designed to be low, and can thus achieve both flexibility and surface hardness. A refractive index in the thickness direction of 1.520 or less can reduce the indentation depth in the thickness direction after unloading a test force and can increase the hardness of film surface, in particular the pencil hardness of a hard coating film formed by laminating a hard coating layer. The refractive index in the thickness direction is more preferably 1.515 or less, still more preferably 1.510 or less, particularly preferably 1.505 or less, and most preferably 1.500 or less. A lower refractive index in the thickness direction is preferable; however, from the standpoint of stable production, the refractive index in the thickness direction is preferably 1.3 or more, and may be even 1.4 or more. The refractive index in the thickness direction is particularly preferably 1.410 or more. The refractive index in the thickness direction within these ranges can be achieved by increasing the draw ratio in both the bending direction and the folding direction. In order to control the refractive index in the thickness direction after controlling the refractive index in the bending direction and in the width direction so as to fall within their preferable ranges, it is preferable to set the conditions while checking the balance of each process condition in the film forming process.

The refractive index in the thickness direction can be controlled so as to fall within the above ranges by drawing preheating temperature, draw temperature, or draw ratio in the bending direction; or drawing preheating temperature, draw temperature, multi-stage drawing, high-ratio drawing, or temperature setting for heat fixation in the direction of the folding portion. The drawing preheating temperature in the bending direction is preferably 70° C. to 110° C. The draw temperature in the bending direction is preferably 75 to 120° C. The draw ratio in the bending direction is preferably 1.2-fold to 2.0-fold, and more preferably 1.7-fold to 2.0-fold. The refractive index in the thickness direction can be effectively reduced, while the flexibility in the bending direction is maintained, by performing drawing with a low draw ratio at a low draw temperature. The drawing preheating temperature in the direction of the folding portion is also preferably 75° C. to 110° C. The draw temperature is preferably 75 to 120° C. The draw ratio in the folding portion is preferably 4.0-fold to 6.0-fold, and more preferably 4.4-fold to 6.0-fold. The refractive index in the thickness direction can be effectively reduced while the refractive index in the bending direction is maintained or reduced. High-ratio drawing may be performed by multi-stage drawing. In this case, setting the draw ratio in the second stage higher than the draw ratio in the first stage is preferable because this enables effective control of the refractive index. The method of performing drawing again after a crystallization step can also be used. Accelerated drawing, in which the drawing rate is increased from the beginning toward the latter half of the drawing process, may be used.

The heat fixation temperature is preferably 180 to 240° C. Heat fixation facilitates crystallization oriented in the drawing direction and reduces the refractive index in the thickness direction. Although it is not necessarily clear why the hardness of film surface is increased by reducing the refractive index in the thickness direction, it is presumed that aromatic moieties such as benzene rings in the molecular chains are oriented in the plane direction, and this has the effect of suppressing deformation caused by stress applied in the thickness direction.

Density of Polyester Film

The density of the polyester film is preferably 1.380 g/cm$^3$ or more, and more preferably 1.383 g/cm$^3$ or more. A density of 1.380 g/cm$^3$ or more can increase flexibility and can increase the hardness of film surface, in particular the pencil hardness of a hard coating film formed by laminating a hard coating layer on the polyester film. A higher density is better.

Although it somewhat depends on, for example, whether particles are present in the film, the density of the polyester film is preferably 1.40 g/cm³ or less. Setting the heat fixation temperature during film formation to 180 to 240° C. facilitates crystallization and thus effectively increases the density.

The bending direction of the polyester film is preferably the longitudinal direction (machine direction). This makes it easier to decrease the refractive index in the bending direction in the second stretching in biaxial stretching and increase flexibility. More specifically, a preferable polyester film can be obtained by drawing an unstretched polyester sheet in the longitudinal direction in a draw ratio of 1.2 to 2.0-fold, more preferably. 1.7 to 2.0-fold. Additionally, in a preferable embodiment, the film is also drawn in the width direction in a draw ratio of 4.0 to 6.0-fold, more preferably 4.4 to 6.0-fold.

In a particularly preferable embodiment of the present invention, the polyester film satisfies the following four characteristics simultaneously:
(1) the polyester film has a refractive index in the bending direction of 1.590 to 1.620,
(2) the polyester film has a refractive index in the direction of a folding portion of 1.670 to 1.700,
(3) the polyester film has a refractive index in the thickness direction of 1.520 or less, and
(4) the polyester film has a density of 1.380 g/cm³ or more.

However, the resulting film may not satisfy the four characteristics simultaneously in the case of a combination of conditions that are not the best options within the individual preferable production conditions (e.g., a combination of a draw ratio in the bending direction of 1.4-fold or less, a draw ratio in the direction of the folding portion of less than 4.4-fold, and a heat fixation temperature of 220° C. or less), among the combinations within the scope of the preferable production conditions. In such a case, the four characteristics may be achieved simultaneously by fine-tuning some conditions or a combination of them, such as increasing the draw ratio in the bending direction to 1.7-fold or more, increasing the draw ratio in the direction of the folding portion to 4.4-fold or more, increasing the heat fixation temperature to about 230° C., and/or decreasing the draw temperature in the bending direction and/or the direction of the folding portion.

To adjust film formability, film strength, thermal dimensional stability, and poor appearance, any film forming method such as drawing, relaxation, heat fixation, and surface treatment may be used. In a particularly preferable embodiment of the present invention, the refractive index and density of the film are controlled so as to fall within the preferable ranges above. Controlling the refractive index and density so as to fall within the preferable ranges above provides a polyester film that is suitable for foldable displays and that exhibits excellent flex resistance and surface hardness, in particular a high level of pencil hardness of a hard coating film formed by laminating a hard coating layer on the polyester film, as compared with conventional films.

Specifically, for example, after PET pellets are sufficiently dried in a vacuum, they are fed into an extruder, and then melted and extruded in a sheet form at about 280° C., followed by cooling and solidifying the sheet to form an unstretched PET sheet. The obtained unstretched sheet is drawn 1.2-fold to 2.0-fold, more preferably 1.7-fold to 2.0-fold in the longitudinal direction, with rolls heated to 75 to 120° C. to obtain a uniaxially oriented PET film. The film is then held with clips at its ends, and guided into a hot air zone heated to 75 to 120° C., and dried, followed by drawing 4.0-fold to 6.0-fold, more preferably 4.4-fold to 6.0-fold in the width direction. Subsequently, the film is guided into a heat treatment zone at 180 to 240° C. and treated with heat for 1 to 60 seconds. During the heat treatment step, the film may optionally be subjected to relaxation treatment by 0 to 10% in the width or longitudinal direction.

The polyester film has an intrinsic viscosity of preferably 0.50 to 1.0 dl/g. An intrinsic viscosity of 0.50 dl/g or more is preferable because such an intrinsic viscosity increases the shock resistance of the film, and thus makes it unlikely for the internal circuitry of a display to become disconnected by an external shock. An intrinsic viscosity of 1.00 dl/g or less is preferable because it prevents filtration pressure of the molten fluid from becoming too high, thus stabilizing film production.

Typically, an organic EL display is used in foldable displays, and a circularly polarizing plate is provided on the viewing side in order to reduce reflected light. From the circularly polarizing plate, linearly polarized light is emitted. Thus, when the display is observed through polarized sunglasses, the screen appears dark from some angles. This state is generally called "blackout." To prevent blackout, the circularly polarizing plate is preferably provided such that the angle made by the absorption axis of the circularly polarizing plate with the slow axis of the polymer film is 10 to 80°. Additionally, to minimize the changes in brightness that occur when the display is rotated, the angle made by the absorption axis of the circularly polarizing plate with the slow axis of the polymer film is preferably 20 to 70°, more preferably 30 to 60°, and particularly preferably 40 to 50°. Ideally, the angle is 45°.

When a display is observed through polarized sunglasses, coloring or iridescent color unevenness (rainbow unevenness) may appear due to in-plane retardation (Re) of the polymer film even if blackout does not occur. This occurs for the following reason. When linearly polarized light emitted from the circularly polarizing plate passes through the polymer film, the light is converted into linearly polarized light that is orthogonal to the original polarized light or elliptically polarized light due to in-plane retardation (Re), which is the product of the birefringence and the thickness of the polymer film. When the converted polarized light is observed through polarized sunglasses, a difference in transmittance arises depending on the state of polarization. Coloring and rainbow unevenness can be prevented by setting the in-plane retardation (Re) of the polymer film to 3000 nm or more. This is because of the following reason. The pattern of conversion of polarization components into linearly polarized light or elliptically polarized light depends on the wavelength and in-plane retardation (Re). This pattern can be repeated in a short wavelength cycle by setting a high in-plane retardation (Re). As a result, the shape of the envelope of the transmitted light spectrum can approximate the emission spectrum of the light source, and it becomes indistinguishable to the human eyes (see FIG. 3).

The lower limit of in-plane retardation (Re) is preferably 4500 nm, and more preferably 6000 nm.

The upper limit of in-plane retardation (Re) is preferably 30000 nm. A polymer film having an in-plane retardation (Re) of more than 30000 nm would not substantially provide an effect of further improving visibility, and may also increase the film thickness, thus decreasing flex resistance. The upper limit of in-plane retardation (Re) is more preferably 20000 nm, still more preferably 15000 nm, particularly preferably 12000 nm, and most preferably 10000 nm.

The in-plane retardation (Re) in the present invention can be determined by measuring the refractive index in the biaxial direction and the thickness, or by using a commercially available automatic birefringence analyzer, such as a KOBRA-21ADH (Oji Scientific Instruments). The slow axis direction can be determined by using a molecular orientation analyzer (e.g., MOA-6004, molecular orientation analyzer, produced by Oji Scientific Instruments).

The OLED light source used in foldable displays has a wide emission spectrum. Thus, the shape of the envelope of the transmitted light spectrum can approximate the emission spectrum of the light source with only a simple structure by setting the in-plane retardation (Re) of the polymer film to within the above ranges.

Easy-to-Adhere Layer

In the present invention, it is also preferable to laminate an easy-to-adhere layer on the polyester film in order to improve the adhesiveness between the polyester film and the hard coating layer or other layers. The easy-to-adhere layer can be obtained by applying a coating solution for forming an easy-to-adhere layer to one or both surfaces of an unstretched or longitudinal, uniaxially oriented film, optionally performing heat treatment to dry the applied coating, and drawing the film in at least one direction in which the film is not stretched. Heat treatment can also be performed after biaxial drawing is performed. It is preferable to control the final amount of the applied easy-to-adhere layer to 0.005 to 0.20 g/m$^2$. An amount of the applied easy-to-adhere layer of 0.005 g/m$^2$ or more is preferable because it provides adhesiveness. An amount of the applied easy-to-adhere layer of 0.20 g/m$^2$ or less is preferable because it provides blocking resistance.

Examples of resins to be contained in the coating solution for use in laminating an easy-to-adhere layer include polyester-based resins, polyether-polyurethane-based resins, polyester polyurethane resins, polycarbonate polyurethane resins, and acrylic resin; these resins can be used without any particular limitation. Examples of crosslinking agents to be contained in the coating solution for forming an easy-to-adhere-layer include melamine compounds, isocyanate compounds, oxazoline compounds, epoxy compounds, and carbodiimide compounds. These crosslinking agents can also be used in a combination of two or more. Due to the nature of in-line coating, these are preferably applied in the form of an aqueous coating solution, and the resins and the crosslinking agents are preferably water-soluble or water-dispersible resins or compounds.

To impart smoothness to the easy-to-adhere layer, it is preferable to add particles. The fine particles preferably have a mean particle size of 2 μm or less. Particles having a mean particle size of more than 2 μm are more likely to come off from the easy-to-adhere layer. Examples of particles to be contained in the easy-to-adhere layer include inorganic particles, such as titanium oxide, barium sulfate, calcium carbonate, calcium sulfate, silica, alumina, talc, kaolin, clay, calcium phosphate, mica, hectorite, zirconia, tungsten oxide, lithium fluoride, and calcium fluoride, and organic polymer particles, such as styrene-based particles, acrylic-based particles, melamine-based particles, benzoguanamine-based particles, and silicone-based particles. These may be singly added to the easy-to-adhere layer, or added in a combination of two or more types.

The method for applying the coating solution for use may be a known method as in the coating layer described above. Examples of methods for applying the coating solution include reverse roll coating, gravure coating, kiss coating, roll brush, spray coating, air-knife coating, wire-bar coating, and pipe doctor. These methods can be used singly or in combination.

Hard Coating Layer

When the polyester film in the present invention is used as a surface protection film for a foldable display by positioning the polyester film on the surface of the display, the polyester film preferably has a hard coating layer on at least one surface of the film. The hard coating layer is preferably used in a display by positioning on the surface of the polyester film that is the front surface of the display. The resin for forming a hard coating layer can be any resin without particular limitations, such as acrylic resins, siloxane resins, inorganic hybrid resins, urethane acrylate resins, polyester acrylate resins, and epoxy resins. These resins may also be used in a combination of two or more. The resin for use may contain particles such as inorganic filler or organic filler.

Film Thickness of Hard Coating Layer

The film thickness of the hard coating layer is preferably 1 to 50 μm. A film thickness of 1 μm or more is preferable because it ensures sufficient curing and leads to a high level of pencil hardness. A film thickness of 50 μm or less suppresses curling caused by hardening and contraction of the hard coating, thus increasing film handleability.

Coating Method

The method for forming a hard coating layer for use may be, for example, a Mayer bar, gravure coater, die coater, or knife coater. These methods can be used without any particular limitation and can be suitably selected according to viscosity and film thickness.

Curing Conditions

The method for curing the hard coating layer for use may be a method using energy beams such as UV light or electron beams, or a method using heat, From the standpoint of minimizing damage to the film, a method using energy beams such as UV light or electron beams is preferable.

Pencil Hardness

The pencil hardness of the hard coating layer is preferably 3H or higher, and more preferably 4H or higher. A pencil hardness of 3H or higher prevents the hard coating layer from being easily scratched, while not decreasing visibility. Although a higher level of pencil hardness of the hard coating layer is generally better, the pencil hardness may be 9H or lower or 8H or lower; even a hard coating layer with a pencil hardness of 6H or lower is usable in practice without problems.

Properties of Hard Coating Layer

The hard coating layer in the present invention can be used for the purpose of protecting a display by increasing the pencil hardness of the surface as described above, and preferably has high transmittance. The hard coating film has a transmittance of preferably 87% or more, and more preferably 88% or more. A transmittance of 87% or more ensures sufficient visibility. In general, a higher total light transmittance of the hard coating film is preferable. However, from the standpoint of stable production, the total light transmittance of the hard coating film is preferably 99% or less, and may be 97% or less. In general, the hard coating film preferably has a lower haze, and preferably a haze of 3% or less. The hard coating film has a haze of more preferably 2% or less, and most preferably 1% or less. A haze of 3% or less can improve the visibility of images. Although a lower haze is generally better, the haze of the hard coating film is preferably 0.1% or more, or may be 0.3% or more, from the standpoint of stable production.

The hard coating layer may have further functions added. For example, a hard coating layer with additional functionality, such as an anti-glare layer, anti-glare anti-reflective layer, anti-reflective layer, low-reflection layer, or antistatic layer having the predetermined pencil hardness above, can also be preferably used in the present invention.

The polyester film used as a substrate film of a touchscreen module may also be provided with a hard coating layer. For example, when an ITO layer is used as a transparent electrode layer of a touchscreen module, a refractive index adjustment layer is preferably provided between the substrate film and the transparent electrode layer to make the electrode pattern less visible. In this case, the hard coating layer itself may serve as a refractive index adjustment layer, or a separate refractive index adjustment layer may be laminated.

EXAMPLES

The following describes the present invention with reference to Examples and Comparative Examples. First, the methods for evaluating characteristic values used in the present invention are described below.
(1) Intrinsic Viscosity A film or polyester resin was crushed, dried, and dissolved in a mixed solvent of phenol and tetrachloroethane in a ratio of phenol to tetrachloroethane of 60/40 (mass ratio). This solution was then centrifuged to remove inorganic particles. The flow time of the solution with a concentration of 0.4 (g/dl) and the flow time of the solvent alone were measured with an Ubbelohde viscometer at 30° C. From the time ratio, the intrinsic viscosity was calculated by using the Huggins equation with the assumption of Huggins's constant being 0.38.
(2) Flex Resistance of Polyester Film Sample (Bend Radius: 1.5 mm)

A polyester film sample with a size of 20 mm in the width direction×110 mm in the machine direction was prepared. The sample was folded 200,000 times at a rate of 1 time/second with a DLDMLH-FS tension-free U-shape folding tester (produced by Yuasa System Co., Ltd.) with the bend radius set to 1.5 mm. During the process, the sample was fixed at 10 mm from both ends of the long side, and the area to be folded was 20 mm×90 mm. FIG. 1 is a schematic diagram showing the bend radius of the foldable display being folded. A bending test was performed as a model test with the portion indicated by numerical reference 11 in FIG. 1 set to 1.5 mm, assuming the case in which a polyester film was provided on the inner surface of the folded display. After folding was ended, the sample was placed on a flat surface with the inner surface of the folded sample facing down and visually observed.
A: No cracks or deformation can be confirmed on the sample.
B: The sample has a crack or a crease, and the maximum height of the lifted portion is 5 mm or more when it is placed horizontally.
(3) Flex Resistance of Polyester Film Sample (Bend Radius: 0.5 mm)

In the same manner as in the above bending test, a sample was folded 200,000 times at a rate of 1 time/second with the bend radius set to 0.5 mm. FIG. 1 is a schematic diagram showing the bend radius of a foldable display being folded. A bending test was performed as a model test with the portion indicated by numerical reference 11 in FIG. 1 set to 0.5 mm, assuming the case in which a polyester film was provided on the inner surface of the folded display. The film surface on the outer side of the folded portion was observed with a digital microscope (RH8800, produced by HIROX) at 700× to examine whether creases (cracks) were present. Separately from the above visual test of flex resistance with a bending radius of 1.5 mm, this test, performed with a smaller bending radius of 0.5 mm, was intended to evaluate a foldable display to which the hard coating layer and other materials are laminated or adhered under conditions close to the actual use conditions of the foldable display. Separately from the visual observation with the bending radius set to 1.5 mm, this test was performed to detect defects that are the likelihood of causing breaks or cracks, which are minute defects difficult to detect visually.
A: No defect is observed on the film surface of the outer side the folded portion.
B: The display has been broken, or creases (cracks) can be observed on the film surface of the outer side of the folded portion.
(4) Refractive Index In accordance with JIS K 7142:2008 (Plastic: Determination of refractive index (method A)), the refractive index in the longitudinal direction, the refractive index in the width direction, and the refractive index in the thickness direction were determined with an Abbe refractometer (NAR-4T, produced by Atago Co., Ltd., measurement wavelength: 589 nm).
(5) Pencil Hardness Pencil hardness was measured under a load of 750 g at rate of 1.0 mm/s with the pencil hardness of a hard coating film as a sample in accordance with JIS K 5600-5-4:1999. In the present invention, a pencil hardness of 3H or more was rated as passing.
(6) Total Light Transmittance and Haze Total light transmittance and haze were measured with a NDH5000 haze meter (produced by Nippon Denshoku Industries Co., Ltd.).
(7) Density Density was measured in accordance with the method described in JIS K 7112:1999 (density-gradient tube method) (unit: g/cm$^3$).
(8) Indentation Depth after Test Force is Unloaded A sample was cut to a size of about 2 cm×2 cm, and the surface opposite the surface to be measured was immobilized on a micro cover glass (18×18 mm, produced by Matsunami Glass Ind., Ltd.) with an adhesive (Cemedine® High-super 30). After being adhered and immobilized, the sample was allowed to stand for at least 12 hours at room temperature. Thereafter, the sample was measured for indentation depth (μm) after a test force was unloaded with a DUH-211 dynamic ultra-micro hardness tester (Shimadzu Corporation) under the following conditions.
Measurement Condition
Test mode: loading-unloading test
Indenter for use: edge angle 115°, triangular pyramid indenter
Indenter elasticity: 1.140×10$^6$ N/mm$^2$
Indenter Poisson's ratio: 0.07
Test force: 50 mN
Loading rate: 4.44 mN/sec
Loading retention time: 2 sec
Unloading retention time: 0 sec
(9) Maximum Heat Shrinkage A sample film was cut to a size of 10 mm (length)×250 mm (width), and a long side was aligned with the direction to be measured and marked at intervals of 200 mm. Distance A, which is between the marks, was measured under constant tension of 5 g. Subsequently, the sample film was allowed to stand in atmosphere at 150° C. in an oven for 30 minutes without a load, and then taken out of the oven, followed by cooling to room temperature. Thereafter, distance B, which is between the marks, was measured under constant tension of 5 g, and the heat shrinkage (%) was determined by using the following formula. The heat shrinkage was measured at three evenly separated points in the width direction of the sample film, and the average of the values at the three points was taken as the heat shrinkage (b).

Heat shrinkage (%)=[(A−B)×100]/A

The sample film was cut so that the vertical and horizontal directions were different for both the bending direction and the folding direction, and measurement was performed. The data of the direction larger in measurement value was taken as the maximum heat shrinkage (%).

(10) In-Plane Retardation (Re)

In-plane retardation refers to a parameter defined as the product (ΔN×d) of anisotropy of the refractive indices of two axes orthogonal to each other on the film (ΔN=|Nx−Ny|) and the film thickness d (nm), and is a measure of optical isotropy or anisotropy. The anisotropy (ΔN) of refractive indices of two axes was determined by the following method. The axis orientation directions of a film were determined by using two polarization plates. The film was cut to a rectangle of 4 cm×2 cm such that the axis orientation directions were orthogonal to each other, and the cut piece was taken as a measurement sample. For this sample, the refractive indices (Nx,Ny) of the two axes that are orthogonal to each other and the refractive index in the thickness direction (Nz) were determined with an Abbe refractometer (NAR-4T, produced by Atago Co., Ltd.). The absolute value of the difference between the refractive indices of the two axes (|Nx−Ny|) was taken as the anisotropy (ΔN) of the refractive indices. The thickness d (nm) of the film was measured with an electric micrometer (Millitron 1245D, produced by Feinpruf GmbH), and the value was converted to the unit nm. From the product (ΔN×d) of the anisotropy (ΔN) of refractive indices and the film thickness d (nm), in-plane retardation (Re) was determined. Of the oriented axes, the axis showing a larger refractive index is defined as a slow axis.

(11) Rainbow Unevenness Observation

An after-window film on the surface of an OLED tablet (Samsung Galaxy Tab S3 SM-T820, 9.7-inch, 32 GB tablet) was peeled off. Instead, the polyester film of the present invention was adhered to the surface by using a commercially available substrate-free optical adhesive sheet such that the bending direction of the polyester film was aligned with the longitudinal direction of the tablet. The absorption axis of the circularly polarizing plate of the tablet was 45° to the longitudinal direction of the tablet, and 45° to the slow axis direction of the polyester film.

The OLED tablet was set to white screen display (R=0, G=0, B=0) and observed from the front and from an oblique direction through polarized sunglasses to determine whether blackout and/or rainbow unevenness was present as described below. Color irregularities observed only on the tablet used were excluded from the determination. Blackout was determined to be present when blackout appeared from the front of the tablet at some angle while the tablet was rotated within the plane.

A: No blackout is observed, and also no rainbow unevenness is observed in the front and oblique directions.

B: No blackout is observed, but some very light rainbow unevenness is observed from an oblique direction.

C: No blackout is observed, but rainbow unevenness is observed from an oblique direction.

D: Blackout is observed.

Preparation of Polyethylene Terephthalate Pellet

The esterification reactor for use was a continuous esterification reactor composed of a three-stage complete mixing tank equipped with a stirrer, a partial condenser, a feedstock inlet, and a product outlet. Slurry of TPA in an amount of 2 tons/hr, 2 mol of EG per mol of TPA, and antimony trioxide in an amount of 160 ppm on an Sb atom basis relative to a produced PET was continuously supplied to the first esterification reaction vessel of the esterification reactor, and allowed to react at 255° C. under ordinary pressure with an average residence time of 4 hours. Subsequently, the reaction product in the first esterification reaction vessel was continuously taken out of the system and supplied to the second esterification reaction vessel. EG distilled from the first esterification reaction vessel in an amount of 8 mass % of the produced polymer (produced PET) was then supplied to the second esterification reaction vessel, and an EG solution containing magnesium acetate in an amount of 65 ppm on a Mg atom basis relative to the produced PET, and an EG solution containing TMPA in an amount of 20 ppm on a P atom basis relative to the produced PET were further added thereto, followed by a reaction at 260° C. under ordinary pressure with an average residence time of 1.5 hours. Subsequently, the reaction product in the second esterification reaction vessel was continuously taken out of the system and supplied to the third esterification reaction vessel, and an EG solution containing TMPA in an amount of 20 ppm on a P atom basis relative to the produced PET was further added thereto, followed by a reaction at 260° C. under ordinary pressure with an average residence time of 0.5 hours. The esterified reaction product generated in the third esterification reaction vessel was continuously supplied to a three-stage continuous polycondensation reactor to perform polycondensation, and filtered through a sintered stainless-steel filter material (nominal filtration accuracy: 5-μm particles are 90% cut), thereby obtaining polyethylene terephthalate pellet (a) with an intrinsic viscosity of 0.62 dl/g.

Preparation of Polyethylene Terephthalate Pellet (b)

Polyethylene terephthalate pellet (b) was obtained in the same manner as above by adjusting the intrinsic viscosity to 0.580 dl/g, except that the residence time of the third esterification reaction was adjusted in the production step of polyethylene terephthalate pellet (a).

Preparation of Polyethylene Terephthalate Pellet (c)

Polyethylene terephthalate pellet (c) with an intrinsic viscosity of 0.75 dl/g was obtained by subjecting polyethylene terephthalate pellet (a) to solid-state polymerization at 220° C. under a reduced pressure of 0.5 mmHg for a different period of time with a rotary vacuum polymerizer.

Polymerization of Urethane Resin 72.96 parts by mass of 1,3-bis(methylisocyanate) cyclohexane, 12.60 parts by mass of dimethylol propionic acid, 11.74 parts by mass of neopentyl glycol, 112.70 parts by mass of polycarbonate diol with a number average molecular weight of 2000, and as solvents, 85.00 parts by mass of acetonitrile and 5.00 parts by mass of N-methylpyrrolidone were placed in a four-necked flask equipped with a stirrer, a Dimroth condenser, a nitrogen-feeding tube, a silica-gel-drying tube, and a thermometer, and stirred in a nitrogen atmosphere at 75° C. for 3 hours; the reaction mixture was confirmed to have reached a predetermined amine equivalent. Subsequently, after this reaction mixture was cooled to 40° C., 9.03 parts by mass of triethyl amine was added, thereby obtaining a polyurethane prepolymer D solution. Subsequently, 450 g of water was added to a reactor equipped with a homogenizing disperser capable of high-speed stirring, and the temperature was adjusted to 25° C., followed by dispersing an isocyanate-terminated prepolymer in water with stirring at 2000 min-1. Thereafter, some acetonitrile and water were removed under reduced pressure, thereby preparing water-soluble polyurethane resin (A) with a solids content of 35 mass %.

Polymerization of Water-soluble Carbodiimide Compound 200 parts by mass of isophorone diisocyanate and 4 parts by mass of 3-methyl-1-phenyl-2-phosphorene-1-oxide (carbodiimidized catalyst) were added to a flask equipped with a thermometer, a nitrogen-gas-feeding tube, a reflux condenser, a dropping funnel, and a stirrer, and stirred in a nitrogen atmosphere at 180° C. for 10 hours, thereby obtaining an isocyanate-terminated isophorone carbodiimide (degree of polymerization: 5). Subsequently, 111.2 g of the obtained carbodiimide and 80 g of polyethylene glycol monomethyl ether (molecular weight: 400) were reacted at 100° C. for 24 hours. Water was gradually added thereto at 50° C., thereby obtaining transparent yellowish water-soluble carbodiimide compound (B) with a solids content of 40 mass.

Preparation of Coating Solution for Forming Easy-to-Adhere-Layer

The following coating materials were mixed, thereby preparing a coating solution.

Water: 16.97 parts by mass
Isopropanol: 21.96 parts by mass
Polyurethane resin (A): 3.27 parts by mass
Water-soluble carbodiimide compound (B): 1.22 parts by mass
Particles: 0.51 parts by mass
(silica sol with a mean particle size of 40 nm, solids concentration: 40 mass)
Surfactant: 0.05 parts by mass
(silicone-based surfactant, solids concentration: 100 mass %)

Preparation of Hard Coating Solution a 0.1 parts by weight of a leveling agent (produced by BYK-Chemie Japan, BYK307, concentration: 100%) were added to 100 parts by weight of a hard coating material (produced by JSR Corporation, OPSTAR® Z7503, concentration: 75%), and the mixture was diluted with methyl ethyl ketone, thereby preparing a hard coating solution a with a solids concentration of 40 wt %.

Example 1

Polyethylene terephthalate pellet (a) was supplied to an extruder and melted at 285° C. This polymer was filtered through a sintered stainless-steel filter material (nominal filtration accuracy: 10-μm particles are 95% cut) and extruded from the outlet into a sheet form. The sheet-form polymer was then brought into contact with a casting drum (surface temperature: 30° C.) by using an electrostatic application casting method to solidify the polymer by cooling, thereby preparing an unstretched film. The unstretched film was uniformly heated to 75° C. by using heating rolls, and then heated to 85° C. using a non-contact heater, followed by roll drawing (drawing in the longitudinal direction) to a 1.4-fold film. Subsequently, the coating solution for forming an easy-to-adhere layer was applied to the both surfaces of the obtained uniaxially stretched film by roll coating, and then dried at 80° C. for 20 seconds. Adjustment was made so that the amount of the applied coating solution for forming an easy-to-adhere layer was 0.06 g/m² after final drying (after being biaxially drawn). Thereafter, the film was guided to a tenter, preheated at 105° C., and laterally stretched 4.0-fold at 95° C. With the width fixed, the film was subjected to heat fixation at 230° C. for 5 seconds, and further relaxed by 4% in the width direction at 180° C., thereby obtaining a polyethylene terephthalate film with a thickness of 50 μm. Tables 1 and 2 show the evaluation results.

Examples 2 and 3

A polyester film was prepared in the same manner as in Example 1, except that the draw ratio in the longitudinal direction was changed as shown in Table 1.

Example 4

A polyester film was prepared in the same manner as in Example 1, except that the draw ratio in the width direction was changed to 4.4-fold, and the heat fixation temperature was changed to 220° C.

Examples 5 and 6

A polyester film was prepared in the same manner as in Example 4, except that the draw ratio in the longitudinal direction was changed as shown in Table 1.

Example 7

A polyester film was prepared in the same manner as in Example 1, except that the draw ratio in the width direction was changed to 5.5-fold, and the heat fixation temperature was changed to 190° C.

Examples 8 and 9

A polyester film was prepared in the same manner as in Example 7, except that the draw ratio in the longitudinal direction was changed as shown in Table 1.

Example 10

A polyester film was prepared in the same manner as in Example 5, except that in the production step of Example 5, the film was drawn in the longitudinal direction, and then subjected to relaxation heat treatment by 10% at 100° C.

Example 11

A polyester film was prepared in the same manner as in Example 5, except that in the production step of Example 5, the film was released from the clips at 200° C. after heat fixation, and the film was subjected to relaxation heat treatment in the longitudinal direction and in the width direction. In the longitudinal direction, the tenter rate and the take-up roll rate were adjusted to achieve a relaxation rate of 3%. The relaxation in the width direction was set to be free.

Example 12

A polyester film was prepared in the same manner as in Example 1, except that the temperature during drawing in the longitudinal direction was changed to 75° C., and the heat fixation temperature was changed to 220° C.

Example 13

A polyester film was prepared in the same manner as in Example 1, except that drawing in the longitudinal direction was performed by changing the temperature to 75° C. and the draw ratio to 1.2-fold, and then drawing in the width direction was performed by changing the draw ratio to 5.0-fold.

Example 14

A polyester film was prepared in the same manner as in Example 3, except that the drawing in the longitudinal direction in Example 3 was changed to two-stage drawing, the draw ratio in the first stage was 1.2-fold, and the draw ratio in the second stage was 1.67-fold. The total draw ratio in the longitudinal direction was about 2.0-fold.

Example 15

A polyester film was prepared in the same manner as in Example 5, except that the preheating temperature during the drawing in the width direction was changed to 95° C., and the heat fixation temperature was changed to 190° C.

Example 16

A polyester film was prepared in the same manner as in Example 2, except that the drawing in the width direction in Example 2 was changed to two-stage drawing, the draw ratio in the first stage was 1.5-fold, the draw ratio in the second stage was 4.0-fold, and the heat fixation temperature was changed to 190° C. The total draw ratio in the width direction was 6.0-fold.

Examples 17 and 18

A polyester film was prepared in the same manner as in Example 2, except that the thickness was changed as shown in Table 2.

Example 19

A polyester film was prepared in the same manner as in Example 1, except that in the production step of Example 1, relaxation heat treatment in the width direction was not performed.

Example 20

In the same manner as in Example 1, an unstretched film was prepared, and then the unstretched film was preheated at 75° C. with a tenter, followed by laterally drawing the film 1.4-fold at 85° C. The coating solution for forming an easy-to-adhere layer was applied to the both surfaces of the obtained uniaxially stretched film by roll coating and dried at 80° C. for 20 seconds. Adjustment was made so that the amount of the applied coating solution for forming an easy-to-adhere layer was 0.06 g/m² after final drying (after being biaxially drawn). The film was uniformly heated to 105° C. by using heating rolls, and then heated to 95° C. using a non-contact heater, followed by roll drawing (drawing in the longitudinal direction) to a 4.0-fold film. With the width fixed, the film was subjected to heat fixation at 230° C. for 5 seconds, thereby obtaining a polyethylene terephthalate film with a thickness of 50 μm.

Comparative Example 1

A polyester film was prepared in the same manner as in Example 1, except that drawing in the longitudinal direction was not performed, and only lateral uniaxial drawing in the width direction was performed.

Comparative Example 2

A polyester film was prepared in the same manner as in Example 7, except that drawing in the longitudinal direction was not performed, and only lateral uniaxial drawing in the width direction was performed.

Comparative Examples 3 to 7

A polyester film was prepared in the same manner as in Example 1, except that the heat fixation temperature was changed to 220° C., and the PET pellet shown in Table 1 was used, while the thickness was changed as shown in Table 2. In Comparative Examples 3 to 7, the heat fixation temperature was lower than in Example 1, and the combination of the draw ratio in the longitudinal direction and the draw ratio in the width direction was not the best, given the preferable range of each draw ratio. Thus, as shown in Table 2, the refractive index in the thickness direction was increased, the indentation depth after unloading the test force was large, and the pencil hardness after lamination of the hard coating layer was also lower than in the Examples.

Comparative Example 8

A polyester film was prepared in the same manner as in Example 1, except that the draw ratio in the longitudinal direction was changed to 2.7-fold, and the heat fixation temperature was changed to 220° C.

Comparative Example 9

A polyester film was prepared in the same manner as in Example 1, except that the draw ratio in the longitudinal direction was changed to 3.4-fold.

Comparative Example 10

A polyester film was prepared in the same manner as in Example 4, except that the heat fixation temperature was changed to 100° C.

Comparative Example 11

A polyester film was prepared in the same manner as in Example 13, except that the draw temperature in the longitudinal direction was changed to 130° C.

Comparative Example 12

A polyester film was prepared in the same manner as in Example 1, except that the preheating temperature in the width direction was changed to 120° C.

Comparative Example 13

A polyester film was prepared in the same manner as in Example 13, except that the draw ratio in the width direction was changed to 5.5-fold, and the heat fixation temperature was changed to 230° C.

Hard coating solution a was applied to one surface of each of the prepared films by using a Mayer bar such that the film thickness was 5 μm on a dry film basis, and dried at 80° C. for 1 minute. The films were then irradiated with UV light (integrated light intensity: 200 mJ/cm$^2$), thereby obtaining hard coating films.

The hard coating films were each laminated on an organic EL module via a 25-μm-thick adhesive layer, thereby preparing foldable smartphone type displays that can be folded in half at their center, with a radius of 3 mm, which corresponds to the bend radius in FIG. 1. Each hard coating film was provided on the surface of the single continuous display via the folding portion so that the hard coating layer was positioned as the front surface of the display. The displays prepared using the hard coating films of the Examples were satisfactory in terms of operation and visibility as a portable smartphone that is foldable in half at their center. The surface of these displays was also not dented by external forces. On the other hand, the foldable displays prepared by using the hard coating films of the Comparative Examples were not so desirable because they appeared to develop image distortion at the folding portion of the display as the frequency of use increased. Additionally, some had dents and scratches on the surface.

TABLE 1

| | PET Pellet | | | PET Film | | | | | |
|---|---|---|---|---|---|---|---|---|---|
| | | Intrinsic | Intrinsic | Draw Ratio | | Drawing Temperature in Longitudinal | Preheating Temperature In Width | Heat Fixation | | |
| | Type | Viscosity (dl/g) | Viscosity (dl/g) | Longitudinal Direction | Width Direction | Direction (° C.) | Direction (° C.) | Temperature (° C.) | Relaxation Direction | Relaxation Rate (%) |
| Example 1 | (a) | 0.62 | 0.58 | 1.4 | 4.0 | 85 | 105 | 230 | Width Direction | 4 |
| Example 2 | (a) | 0.62 | 0.58 | 1.7 | 4.0 | 85 | 105 | 230 | Width Direction | 4 |
| Example 3 | (a) | 0.62 | 0.58 | 2.0 | 4.0 | 85 | 105 | 230 | Width Direction | 4 |
| Example 4 | (a) | 0.62 | 0.58 | 1.4 | 4.4 | 85 | 105 | 220 | Width Direction | 4 |
| Example 5 | (a) | 0.62 | 0.58 | 1.7 | 4.4 | 85 | 105 | 220 | Width Direction | 4 |
| Example 6 | (a) | 0.62 | 0.58 | 2.0 | 4.4 | 85 | 105 | 220 | Width Direction | 4 |
| Example 7 | (a) | 0.62 | 0.58 | 1.4 | 5.5 | 85 | 105 | 190 | Width Direction | 4 |
| Example 8 | (a) | 0.62 | 0.58 | 1.7 | 5.5 | 85 | 105 | 190 | Width Direction | 4 |
| Example 9 | (a) | 0.62 | 0.58 | 2.0 | 5.5 | 85 | 105 | 190 | Width Direction | 4 |
| Example 10 | (a) | 0.62 | 0.58 | 1.7 | 4.4 | 85 | 105 | 220 | Longitudinal Direction | 10 |
| Example 11 | (a) | 0.62 | 0.58 | 1.7 | 4.4 | 85 | 105 | 220 | Longitudinal/ Width | 3/– |
| Example 12 | (a) | 0.62 | 0.58 | 1.4 | 4.0 | 75 | 105 | 220 | Width Direction | 4 |
| Example 13 | (a) | 0.62 | 0.58 | 1.2 | 5.0 | 75 | 105 | 220 | Width Direction | 4 |
| Example 14 | (a) | 0.62 | 0.58 | 2.0 (2 stages) | 4.0 | 85 | 105 | 230 | Width Direction | 4 |
| Example 15 | (a) | 0.62 | 0.58 | 1.7 | 4.4 | 85 | 95 | 100 | Width Direction | 4 |
| Example 16 | (a) | 0.62 | 0.58 | 1.7 | 6.0 (2 stages) | 85 | 105 | 190 | Width Direction | 4 |
| Example 17 | (a) | 0.62 | 0.58 | 1.7 | 4.0 | 85 | 105 | 230 | Width Direction | 4 |
| Example 18 | (a) | 0.62 | 0.58 | 1.7 | 4.0 | 85 | 105 | 230 | Width Direction | 4 |
| Example 19 | (a) | 0.62 | 0.58 | 1.4 | 4.0 | 85 | 105 | 230 | — | 0 |
| Example 20 | (a) | 0.62 | 0.58 | 4.0 | 1.4 | 105 | 85 | 230 | — | 0 |
| Comparative Example 1 | (a) | 0.62 | 0.58 | 1.0 | 4.0 | — | 105 | 220 | Width Direction | 4 |
| Comparative Example 2 | (a) | 0.62 | 0.58 | 1.0 | 5.5 | — | 105 | 190 | Width Direction | 4 |
| Comparative Example 3 | (a) | 0.62 | 0.58 | 1.4 | 4.0 | 85 | 105 | 220 | Width Direction | 4 |
| Comparative Example 4 | (a) | 0.42 | 0.58 | 1.4 | 4.0 | 85 | 105 | 220 | Width Direction | 4 |
| Comparative Example 5 | (a) | 0.62 | 0.58 | 1.4 | 4.0 | 85 | 105 | 220 | Width Direction | 4 |
| Comparative Example 6 | (b) | 0.58 | 0.54 | 1.4 | 4.0 | 85 | 105 | 220 | Width Direction | 4 |
| Comparative Example 7 | (c) | 0.75 | 0.69 | 1.4 | 4.0 | 85 | 105 | 220 | Width Direction | 4 |

TABLE 1-continued

| | PET Pellet | | | PET Film | | | | | | |
|---|---|---|---|---|---|---|---|---|---|---|
| | | Intrinsic Viscosity (dl/g) | Intrinsic Viscosity (dl/g) | Draw Ratio | | Drawing Temperature in Longitudinal Direction (° C.) | Preheating Temperature In Width Direction (° C.) | Heat Fixation Temperature (° C.) | Relaxation Direction | Relaxation Rate (%) |
| | Type | | | Longitudinal Direction | Width Direction | | | | | |
| Comparative Example 8 | (a) | 0.62 | 0.58 | 2.7 | 4.0 | 85 | 105 | 220 | Width Direction | 4 |
| Comparative Example 9 | (a) | 0.62 | 0.58 | 3.4 | 4.0 | 85 | 105 | 230 | Width Direction | 4 |
| Comparative Example 10 | (a) | 0.62 | 0.58 | 1.4 | 4.4 | 85 | 105 | 100 | Width Direction | 4 |
| Comparative Example 11 | (a) | 0.62 | 0.58 | 1.2 | 5.0 | 130 | 105 | 220 | Width Direction | 4 |
| Comparative Example 12 | (a) | 0.62 | 0.58 | 1.4 | 4.0 | 85 | 120 | 230 | Width Direction | 4 |
| Comparative Example 13 | (a) | 0.62 | 0.58 | 1.2 | 5.5 | 85 | 105 | 230 | Width Direction | 4 |

TABLE 2

| | PET Film | | | | | | |
|---|---|---|---|---|---|---|---|
| | Thickness (μm) | Density (g/cm³) | Refractive Index | | | Bending Direction | Continuous Bending Test with Bend Radius of 1.5 mm | Continuous Bending Test with Bend Radius of 0.5 mm |
| | | | Longitudinal Direction | Width Direction | Thickness Direction | | | |
| Example 1 | 50 | 1.385 | 1.506 | 1.684 | 1.516 | Longitudinal Direction | A | A |
| Example 2 | 50 | 1.385 | 1.602 | 1.681 | 1.512 | Longitudinal Direction | A | A |
| Example 3 | 50 | 1.387 | 1.609 | 1.879 | 1.509 | Longitudinal Direction | A | A |
| Example 4 | 50 | 1.383 | 1.592 | 1.69 | 1.517 | Longitudinal Direction | A | A |
| Example 5 | 50 | 1.383 | 1.597 | 1.688 | 1.515 | Longitudinal Direction | A | A |
| Example 8 | 50 | 1.384 | 1.598 | 1.688 | 1.513 | Longitudinal Direction | A | A |
| Example 7 | 50 | 1.383 | 1.591 | 1.694 | 1.513 | Longitudinal Direction | A | A |
| Example 8 | 50 | 1.383 | 1.598 | 1.690 | 1.512 | Longitudinal Direction | A | A |
| Example 9 | 50 | 1.383 | 1.597 | 1.688 | 1.513 | Longitudinal Direction | A | A |
| Example 10 | 50 | 1.385 | 1.594 | 1.689 | 1.515 | Longitudinal Direction | A | A |
| Example 11 | 50 | 1.385 | 1.596 | 1.687 | 1.515 | Longitudinal Direction | A | A |
| Example 12 | 50 | 1.385 | 1.606 | 1.684 | 1.518 | Longitudinal Direction | A | A |
| Example 13 | 50 | 1.386 | 1.591 | 1.685 | 1.519 | Longitudinal Direction | A | A |
| Example 14 | 50 | 1.388 | 1.806 | 1.881 | 1.511 | Longitudinal Direction | A | A |
| Example 15 | 50 | 1.383 | 1.598 | 1.691 | 1.495 | Longitudinal Direction | A | A |
| Example 16 | 50 | 1.384 | 1.594 | 1.895 | 1.508 | Longitudinal Direction | A | A |
| Example 17 | 25 | 1.387 | 1.602 | 1.681 | 1.512 | Longitudinal Direction | A | A |
| Example 18 | 75 | 1.388 | 1.602 | 1.681 | 1.512 | Longitudinal Direction | A | A |
| Example 19 | 50 | 1.384 | 1.598 | 1.887 | 1.513 | Longitudinal Direction | A | A |
| Example 20 | 50 | 1.385 | 1.686 | 1.593 | 1.516 | Width Direction | A | A |

TABLE 2-continued

| | | | | | | | | |
|---|---|---|---|---|---|---|---|---|
| Comparative Example 1 | 50 | 1.380 | 1.588 | 1.894 | 1.522 | Longitudinal Direction | A | B |
| Comparative Example 2 | 50 | 1.383 | 1.584 | 1.701 | 1.512 | Longitudinal Direction | A | B |
| Comparative Example 3 | 50 | 1.381 | 1.601 | 1.684 | 1.524 | Longitudinal Direction | A | A |
| Comparative Example 4 | 25 | 1.381 | 1.501 | 1.676 | 1.530 | Longitudinal Direction | A | A |
| Comparative Example 5 | 75 | 1.381 | 1.623 | 1.590 | 1.528 | Longitudinal Direction | B | A |
| Comparative Example 6 | 50 | 1.382 | 1.568 | 1.682 | 1.524 | Longitudinal Direction | A | A |
| Comparative Example 7 | 50 | 1.380 | 1.603 | 1.686 | 1.522 | Longitudinal Direction | A | A |
| Comparative Example 8 | 50 | 1.398 | 1.631 | 1.588 | 1.500 | Longitudinal Direction | B | A |
| Comparative Example 9 | 50 | 1.306 | 1.650 | 1.869 | 1.496 | Longitudinal Direction | B | A |
| Comparative Example 10 | 50 | 1.384 | 1.578 | 1.660 | 1.532 | Longitudinal Direction | B | A |
| Comparative Example 11 | 50 | 1.385 | 1.589 | 1.685 | 1.525 | Longitudinal Direction | A | B |
| Comparative Example 12 | 50 | 1.384 | 1.596 | 1.879 | 1.526 | Longitudinal Direction | A | A |
| Comparative Example 13 | 50 | 1.383 | 1.502 | 1.701 | 1.504 | Longitudinal Direction | A | B |

| | PET Film | | | | | | |
|---|---|---|---|---|---|---|---|
| | Indentation Depth after Unloading (μm) | ΔN | In-Plane Retardation (Re) (nm) | Rainbow Unevenness Observation | Total Light Transmittance (%) | Haze (%) | Maximum Heat Shrinkage (%) | Hard Coating Film Pencil Hardness |
| Example 1 | 1.48 | 0.088 | 4385 | C to B | 91 | 0.8 | 1.4 | 3 H |
| Example 2 | 1.47 | 0.079 | 3937 | C to B | 91 | 0.8 | 1.6 | 3 H |
| Example 3 | 1.42 | 0.070 | 3617 | B | 91 | 0.8 | 1.8 | 3 H |
| Example 4 | 1.48 | 0.098 | 4900 | B | 91 | 0.8 | 1.7 | 3 H |
| Example 6 | 1.45 | 0.091 | 4550 | B | 91 | 0.8 | 1.9 | 3 H |
| Example 6 | 1.4 | 0.088 | 4400 | C to B | 91 | 0.8 | 2.2 | 3 H |
| Example 7 | 1.36 | 0.103 | 5165 | A | 91 | 0.8 | 4.4 | 3 H |
| Example 8 | 1.38 | 0.094 | 4705 | B | 91 | 0.8 | 4.9 | 3 H |
| Example 9 | 1.41 | 0.091 | 4567 | B | 91 | 0.8 | 6.1 | 3 H |
| Example 10 | 1.45 | 0.096 | 4760 | B | 91 | 0.8 | 1.0 | 3 H |
| Example 11 | 1.45 | 0.091 | 4650 | B | 91 | 0.8 | 0.8 | 3 H |
| Example 12 | 1.48 | 0.078 | 3915 | C to B | 91 | 0.8 | 1.6 | 3 H |
| Example 13 | 1.48 | 0.094 | 4700 | B | 91 | 0.8 | 1.6 | 3 H |
| Example 14 | 1.43 | 0.075 | 3750 | C to B | 91 | 0.8 | 1.6 | 3 H |
| Example 15 | 1.27 | 0.093 | 4660 | B | 91 | 0.8 | 6.0 | 3 H |
| Example 16 | 1.26 | 0.101 | 6060 | B | 91 | 0.8 | 4.7 | 3 H |
| Example 17 | 1.47 | 0.079 | 1968 | C | 91 | 0.8 | 1.4 | 3 H |
| Example 18 | 1.47 | 0.079 | 5905 | A | 91 | 0.8 | 1.6 | 3 H |
| Example 19 | 1.48 | 0.089 | 4450 | C to B | 91 | 0.8 | 2.0 | 3 H |
| Example 20 | 1.48 | 0.093 | 4660 | B | 91 | 0.8 | 1.6 | 3 H |
| Comparative Example 1 | 1.64 | 0.106 | 5260 | B | 91 | 0.8 | 1.4 | 1 H |
| Comparative Example 2 | 1.56 | 0.118 | 5886 | A | 91 | 0.8 | 3.7 | 2 H |
| Comparative Example 3 | 1.60 | 0.083 | 4155 | C to B | 91 | 0.8 | 1.8 | 2 H |
| Comparative Example 4 | 1.62 | 0.085 | 2120 | C | 91 | 0.8 | 1.8 | 2 H |
| Comparative Example 5 | 1.63 | 0.087 | 6025 | B | 91 | 0.8 | 1.8 | 2 H |
| Comparative Example 6 | 1.68 | 0.084 | 4200 | C to B | 91 | 0.8 | 1.8 | 2 H |
| Comparative Example 7 | 1.56 | 0.083 | 4160 | C to B | 91 | 0.8 | 1.8 | 2 H |
| Comparative Example 8 | 1.46 | 0.056 | 2760 | C | 91 | 0.8 | 1.6 | 3 H |
| Comparative Example 9 | 1.36 | 0.019 | 950 | C | 91 | 0.8 | 1.0 | 3 H |
| Comparative Example 10 | 1.56 | 0.082 | 4112 | C to B | 91 | 0.8 | 6.3 | 2 H |
| Comparative Example 11 | 1.55 | 0.096 | 4800 | B | 91 | 0.8 | 1.6 | 2 H |

TABLE 2-continued

| | | | | | | | | |
|---|---|---|---|---|---|---|---|---|
| Comparative Example 12 | 1.55 | 0.083 | 4137 | C to B | 91 | 0.8 | 1.4 | 2 H |
| Comparative Example 13 | 1.50 | 0.109 | 5463 | A | 91 | 0.8 | 1.6 | 2 H |

INDUSTRIAL APPLICABILITY

While maintaining its suitability in mass production, the foldable display using the polyester film or the hard coating film for foldable displays of the present invention is unlikely to deform after the polyester film or the hard coating film positioned on the front surface of the foldable display is repeatedly folded, thus not causing image distortion at the folding portion of the display. In particular, a mobile device or image display device equipped with the foldable display using the polyester film or hard coating film of the present invention as a surface protection film provides beautiful images and has a variety of functionality, while being highly convenient such as in portability.

DESCRIPTION OF THE REFERENCE NUMERALS

1: foldable display
11: bend radius
2: polyester film for surface protection films of foldable displays
21: folding portion
22: bending direction (the direction orthogonal to the folding portion)

The invention claimed is:

1. A foldable display comprising a surface protection film and a polarizer, wherein
the surface protection film comprises a polyester film,
the angle made by the slow axis of the polyester film with the absorption axis of the polarizer is 10 to 80°, and
the polyester film satisfies the following conditions:
(1) the polyester film has a refractive index in the bending direction of 1.590 to 1.606,
(2) the polyester film has a refractive index in the direction of a folding portion of 1.670 to 1.700,
(3) the polyester film has a refractive index in the thickness direction of 1.520 or less, and
(4) the polyester film has a density of 1.380 g/cm$^3$ or more,
wherein the bending direction refers to a direction orthogonal to the folding portion of the polyester film to be folded,
wherein the polyester film is a biaxially stretched polyethylene terephthalate film,
wherein the foldable display comprises an easy-to-adhere layer on at least one surface of the polyester film and a hard coating layer having a thickness of 1 to 50 μm on at least one surface of the polyester film, and
wherein the hard coating layer is present on the easy-to-adhere layer on at least one surface of the polyester film.

2. The foldable display according to claim 1, wherein the polyester film has an in-plane retardation (Re) of 3000 to 30000 nm.

3. The foldable display according to claim 1, wherein the polyester film has a total light transmittance of 85% or more, a haze of 3% or less, and a maximum heat shrinkage of 6% or less.

4. A mobile device comprising the foldable display of claim 1.

5. The foldable display according to claim 2, wherein the polyester film has a total light transmittance of 85% or more, a haze of 3% or less, and a maximum heat shrinkage of 6% or less.

6. A mobile device comprising the foldable display of claim 2.

7. A mobile device comprising the foldable display of claim 3.

8. A mobile device comprising the foldable display of claim 5.

* * * * *